United States Patent
Schrems et al.

(10) Patent No.: US 10,217,715 B2
(45) Date of Patent: Feb. 26, 2019

(54) SEMICONDUCTOR DEVICE WITH A BUMP CONTACT ON A TSV COMPRISING A CAVITY AND METHOD OF PRODUCING SUCH A SEMICONDUCTOR DEVICE

(71) Applicant: ams AG, Unterpremstaetten (AT)

(72) Inventors: Martin Schrems, Eggersdorf (AT); Bernhard Stering, Stainz (AT); Harald Etschmaier, Graz (AT)

(73) Assignee: ams AG, Unterpremstaetten (AT)

( * ) Notice: Subject to any disclaimer, the term of this patent is extended or adjusted under 35 U.S.C. 154(b) by 141 days.

(21) Appl. No.: 15/118,469

(22) PCT Filed: Feb. 9, 2015

(86) PCT No.: PCT/EP2015/052647
§ 371 (c)(1),
(2) Date: Aug. 11, 2016

(87) PCT Pub. No.: WO2015/121199
PCT Pub. Date: Aug. 20, 2015

(65) Prior Publication Data
US 2017/0179056 A1 Jun. 22, 2017

(30) Foreign Application Priority Data

Feb. 12, 2014 (EP) .................................... 14154852

(51) Int. Cl.
*H01L 23/00* (2006.01)
*H01L 23/31* (2006.01)
(Continued)

(52) U.S. Cl.
CPC .............. *H01L 24/11* (2013.01); *H01L 23/31* (2013.01); *H01L 23/3157* (2013.01);
(Continued)

(58) Field of Classification Search
CPC ........... H01L 25/0657; H01L 21/76898; H01L 2225/06513; H01L 2225/06541;
(Continued)

(56) References Cited

U.S. PATENT DOCUMENTS 6,380,060 B1   4/2002   Zohni
8,310,058 B2  11/2012   Lin et al.
(Continued)

FOREIGN PATENT DOCUMENTS

DE   102009012643 A1   10/2009
EP       2620978 A1    7/2013

*Primary Examiner* — Yu-Hsi D Sun
(74) *Attorney, Agent, or Firm* — Fish & Richardson P.C.

(57) ABSTRACT

The semiconductor device comprises a semiconductor substrate (1) with a main surface (10) and a further main surface (11) opposite the main surface, a TSV (3) penetrating the substrate from the main surface to the further main surface, a metallization (13) of the TSV, an under-bump metallization (5) and a bump contact (6) at least partially covering the TSV at the further main surface. The TSV (3) comprises a cavity (15), which may be filled with a gas or liquid. An opening (15') of the cavity is provided to expose the cavity to the environment.

10 Claims, 4 Drawing Sheets

(51) Int. Cl.
*H01L 23/48* (2006.01)
*H01L 23/485* (2006.01)

(52) U.S. Cl.
CPC .......... *H01L 23/481* (2013.01); *H01L 23/485* (2013.01); *H01L 24/03* (2013.01); *H01L 24/05* (2013.01); *H01L 24/13* (2013.01); *H01L 24/14* (2013.01); *H01L 23/562* (2013.01); *H01L 2224/02125* (2013.01); *H01L 2224/03001* (2013.01); *H01L 2224/0401* (2013.01); *H01L 2224/0557* (2013.01); *H01L 2224/05551* (2013.01); *H01L 2224/05555* (2013.01); *H01L 2224/05563* (2013.01); *H01L 2224/05573* (2013.01); *H01L 2224/05576* (2013.01); *H01L 2224/05599* (2013.01); *H01L 2224/131* (2013.01); *H01L 2224/13023* (2013.01); *H01L 2224/13025* (2013.01); *H01L 2224/13027* (2013.01)

(58) Field of Classification Search
CPC ............. H01L 23/481; H01L 23/49827; H01L 23/5226; H01L 24/13; H01L 2225/06548; H01L 2224/0401; H01L 24/14; H01L 24/16; H01L 21/76877
See application file for complete search history.

(56) References Cited

U.S. PATENT DOCUMENTS

| | | |
|---|---|---|
| 2002/0084312 A1 | 7/2002 | Shier et al. |
| 2009/0243047 A1 | 10/2009 | Wolter et al. |
| 2010/0171209 A1 | 7/2010 | Tanie et al. |
| 2011/0272801 A1 | 11/2011 | Fiori et al. |
| 2012/0306085 A1* | 12/2012 | West .................. H01L 23/481 257/762 |
| 2013/0026645 A1 | 1/2013 | Mohammed et al. |
| 2013/0040453 A1 | 2/2013 | Chen et al. |
| 2013/0087893 A1 | 4/2013 | Jebory et al. |
| 2013/0249098 A1 | 9/2013 | West |
| 2013/0328209 A1 | 12/2013 | Selvanayagam et al. |
| 2015/0064899 A1* | 3/2015 | Ji .................. H01L 21/76898 438/614 |

* cited by examiner

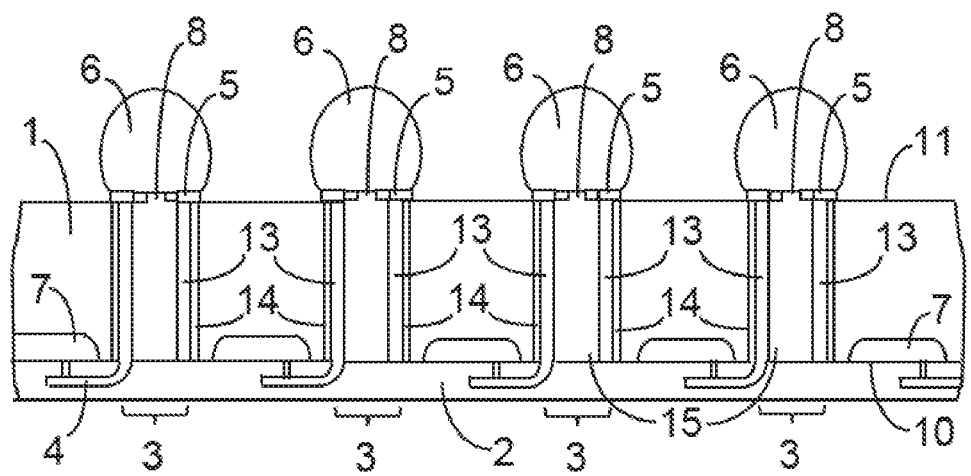
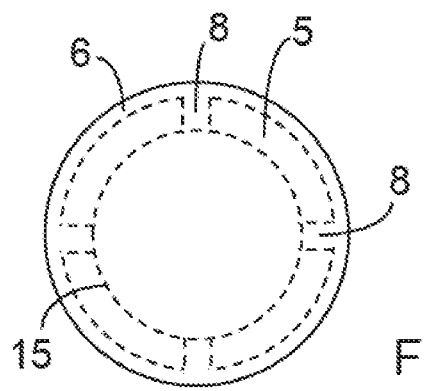
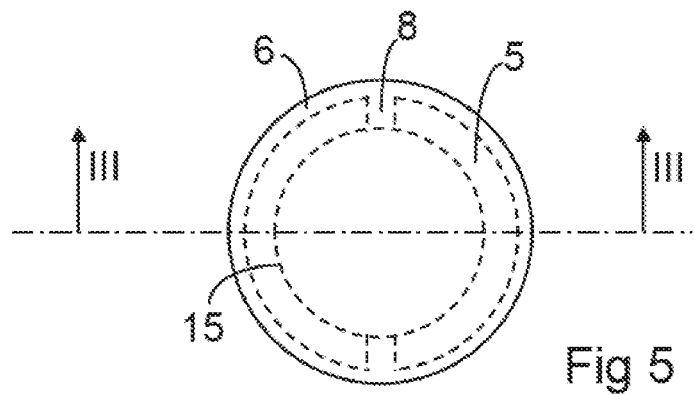

SEMICONDUCTOR DEVICE WITH A BUMP CONTACT ON A TSV COMPRISING A CAVITY AND METHOD OF PRODUCING SUCH A SEMICONDUCTOR DEVICE

BACKGROUND OF THE INVENTION

The increasing density of components that are integrated in semiconductor devices requires an increasing density of electrical interconnections between these components. This may be achieved with the aid of through substrate vias (TSVs), which have typical diameters in the range from 2 µm to 100 µm. It may be preferable not to fill the TSVs with electrically conductive material in order to reduce thermal stress occurring in the semiconductor substrate. Unfilled TSVs may be closed, but the closure is easily damaged when the ambient temperature rises and gas remaining inside the closed TSV expands. This may especially happen during reflow soldering in the manufacturing process.

U.S. Pat. No. 8,310,058 B2 discloses a semiconductor device comprising a TSV formed in the substrate by deposition of an electrically conductive material. An under-bump metallization (UBM) layer is formed on a backside of the substrate in electrical contact with the TSV. A solder material is deposited on the UBM layer and reflowed to form a solder bump.

US 2010/0171209 A1 discloses a semiconductor device formed with stacked semiconductor chips having hollow TSVs, each of which has a tapered portion. The chips are connected to one another by solder balls, which comprise a core of a material that has a higher melting point than the surrounding solder material. The diameter of the core can be adapted to reduce stress occurring around the electrode.

US 2013/0040453 A1 discloses a method of forming an UBM layer over a plurality of TSVs. The UBM is connected to a selected portion of the TSVs in common.

US 2013/0087893 A1 discloses a semiconductor substrate comprising a plurality of TSVs. A conductive filler is disposed in each TSV with a void left in the center to reduce the thermal stress in the semiconductor substrate.

US 2013/0026645 A1 discloses a semiconductor component with a conductive via through the substrate. A recess is provided at one or both axial ends of the via. A conductive pad contacting the via has an opening in the area of the recess.

DE 102009012643 A1 discloses a connecting structure for electronic devices comprising a silicon substrate. Contact elements penetrating the substrate are formed as piles and surrounded by void regions, which allow the contact elements to perform two-dimensional movements in the case of thermal expansion or mechanical stress. Solder bumps are arranged on the contact elements near the open ends of the void regions.

US 2013/0249098 A1 discloses a semiconductor device with a layer for protecting TSV tips during thermo-compressive bonding. The TSV tips are covered with metal caps and the protective layer. The opposite ends of the TSVs are provided with pillars, which are capped with solder.

US 2013/0328209 A1 discloses a stack arrangement including a semiconductor substrate, a via formed through the substrate, a conductive portion arranged in the via, and an interconnect portion arranged below the via on a bond pad portion.

US 2009/0243047 A1 discloses a semiconductor device with an interconnection, which is formed by a conductor in a through hole penetrating the semiconductor substrate. An end portion of the conductor extends beyond the substrate and forms a bump, which is covered with a contact pad. The through hole widens towards the bump, and the gap between the hole and the conductor is filled with a dielectric flexible material.

US 2011/0272801 A1 discloses a semiconductor device with connection pads provided with inserts. Cavities formed in the pads are filled with a material that is different from the material of the pads, in particular with silicon oxide.

SUMMARY OF THE INVENTION

The semiconductor device comprises a semiconductor substrate with a main surface and a further main surface opposite the main surface, a TSV (through-substrate via) penetrating the substrate from the main surface to the further main surface, a cavity of the TSV, a metallization of the TSV arranged between the substrate and the cavity, an under-bump metallization arranged adjacent to the cavity at the further main surface, a bump contact arranged on the under-bump metallization, and an opening that provides a communication between the cavity of the TSV and an environment, which can be the ambient air, for instance. The bump contact covers the cavity at least partially.

The cavity of the TSV can be filled with a gas or a liquid. A cover layer can be arranged above the TSV at the main surface. The opening of the cavity prevents an occurrence of a pressure acting on the cover layer in the region above the cavity of the TSV.

In an embodiment of the semiconductor device, the bump-contact covers the cavity only partially, thus forming the opening.

In a further embodiment, the under-bump metallization does not encircle the cavity, and the bump-contact covers the cavity without closing it, so that the opening is present under the bump-contact.

In a further embodiment, the opening is provided by a channel in the under-bump metallization.

In a further embodiment, a cover layer is arranged above the TSV at the main surface.

In a further embodiment, the opening is provided by a hole in the cover layer.

In a further embodiment, an integrated circuit component is arranged in the semiconductor substrate, and the integrated circuit component is provided with a wiring including at least one metal layer arranged in the cover layer.

The method of producing embodiments of such a semiconductor device comprises providing a semiconductor substrate with a TSV penetrating the substrate from a main surface to an opposite further main surface, arranging a metallization in the TSV thus forming a cavity, so that the metallization is arranged between the substrate and the cavity, arranging an under-bump metallization adjacent to the TSV at the further main surface, and arranging a bump contact on the under-bump metallization. An opening of the cavity is formed at the main surface or at the further main surface to provide a communication between the cavity and the environment.

In a variant of the method, a cover layer is arranged above the TSV at the main surface, and the opening is formed by a hole in the cover layer.

In a further variant of the method, the opening is formed by arranging the under-bump metallization so as not to encircle the cavity.

In a further variant of the method, the opening is formed by structuring the under-bump metallization, so that the under-bump metallization forms a channel between the cavity and the environment.

In a further variant of the method, a predetermined breaking point comprising a material different from the under-bump metallization is arranged at the location provided for the channel, and the material of the predetermined breaking point is cracked or made porous during or after the formation of the bump contact, so that the channel is formed.

In a further variant of the method, the predetermined breaking point is formed by a material that cracks or becomes porous at a temperature above 200° C., and the bump contact is formed by a reflow process at a temperature above 200° C. The predetermined breaking point may be formed by a photoresist.

The following is a detailed description of examples of the semiconductor device and of examples of the method for producing the semiconductor device.

BRIEF DESCRIPTION OF THE DRAWINGS

FIG. 3 is a cross section of a further embodiment of the semiconductor device comprising a venting channel.

FIG. 4 is a schematic top view of a bump contact of an embodiment comprising a venting channel.

FIG. 5 is a schematic top view of a bump contact of the embodiment according to FIG. 3.

DETAILED DESCRIPTION

Figure 1:
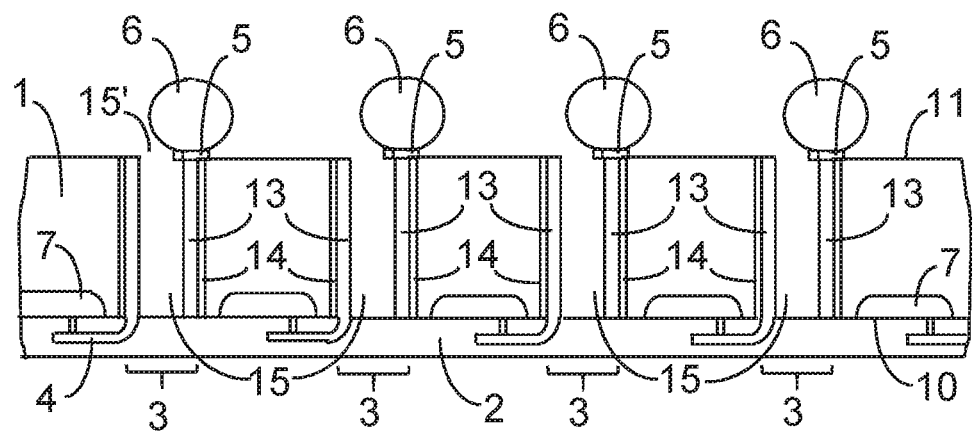
FIG. 1 is a cross section of an embodiment of the semiconductor device.

FIG. 1 is a cross section of an embodiment of the semiconductor device comprising a semiconductor substrate 1 with a main surface 10 and a further main surface 11 opposite the main surface 10. A cover layer 2 is arranged on the main surface 10. The cover layer 2 may be a dielectric layer, for instance, or it may be a wiring layer comprising structured metal layers 4 and interconnections of a wiring embedded in dielectric material.

The substrate 1 comprises at least one through-substrate via 3, abbreviated TSV, including a metallization 13, which is optionally insulated from the semiconductor material of the substrate 1 by dielectric material forming a sidewall 14, and a central cavity 15, which may be filled with a gas or liquid, for instance. The TSV 3 is provided as an electrical connection between electrical conductors that are arranged on or above the main surface 10 and further electrical conductors that are arranged on or above the further main surface 11.

The TSV 3 may especially be provided to connect a terminal of a circuit component 7 that is integrated in the semiconductor substrate 1 with an electrical terminal that is arranged on or above the further main surface 11. The semiconductor substrate 1 can instead be a passive component, especially a component used as an interposer for a redistribution of electrical connections, for instance.

The cover layer 2 closes the cavity 15 of the TSV 3 at the main surface 10. A bump contact 6, which may be a solder ball, for instance, is arranged at the further main surface 11 on an under-bump metallization 5, which is arranged adjacent to the cavity 15. The bump contact 6 may have an essentially spherical shape. It may be placed laterally with respect to a center of the TSV 3. The bump contact 6 is electrically connected to the metallization 13 of the TSV 3. The bump contact 6 at least partially covers the cavity 15 but does not close it. The remaining small opening 15' of the cavity 15 serves as a venting channel.

Figure 2:
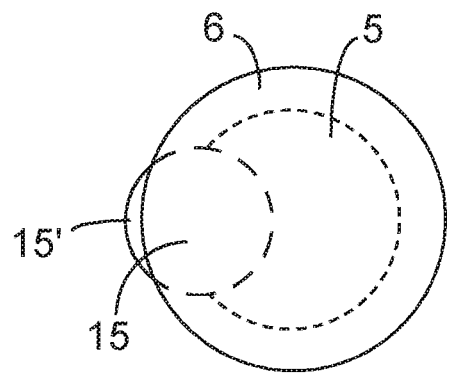
FIG. 2 is a schematic top view of a bump contact of the embodiment according to FIG. 1.

FIG. 2 is a schematic top view of the bump contact 6 of the embodiment according to FIG. 1. The cavity 15 may have any suitable shape and may typically be essentially cylindrical. FIG. 2 shows the circular contour of a cylindrical cavity 15, by way of example. As the cavity 15 is at least partially hidden under the bump contact 6, a hidden section of the circular contour is represented by a broken arc. The area of the under-bump metallization 5, which does not encircle the cavity 15, is limited by the cavity 15 and may typically be further limited by a section of an arc of a circle, for instance, as indicated in FIG. 2.

FIG. 2 shows an uncovered region of the cavity 15 outside the periphery of the bump contact 6. The bump contact 6 may instead cover the cavity 15 without closing it. In each case the bump contact 6 leaves the opening 15' of the cavity 15.

FIG. 3 is a cross section of a further embodiment of the semiconductor device comprising a channel 8 in the layer of the under-bump metallization 5. Elements of the embodiment according to FIG. 3 that correspond to elements of the embodiment according to FIG. 1 are designated with the same reference numerals. In the embodiment according to FIG. 3, the under-bump metallization 5 comprises a channel 8, which provides a connection between the cavity 15 of the TSV 3 and the environment, in particular the ambient air. The channel 8 thus functions as a venting channel. The bump contact 6 spans the channel 8.

FIG. 4 is a schematic top view of a bump contact 6 of an embodiment comprising a channel 8 within the layer of the under-bump metallization 5. In this embodiment the under-bump metallization 5 may form a ring around the cavity 15 of the TSV 3, for instance. The channel 8 can have any shape, provided that the channel 8 extends from the cavity 15 to the outer periphery of the under-bump metallization 5, so that the cavity 15 communicates with the environment. In the embodiment according to FIG. 4, the channel 8 comprises four passages arranged on orthogonal diameters of the under-bump metallization 5. Arrangement and shape of the channel 8 are not restricted to the example represented in FIG. 4.

FIG. 5 is a schematic top view of the bump contact 6 of the embodiment according to FIG. 3. In this example the channel 8 comprises only two passages on a diameter of the under-bump metallization 5. The position of the cross section of FIG. 3 is indicated in FIG. 5 by the straight line of dots and dashes.

Figure 6:
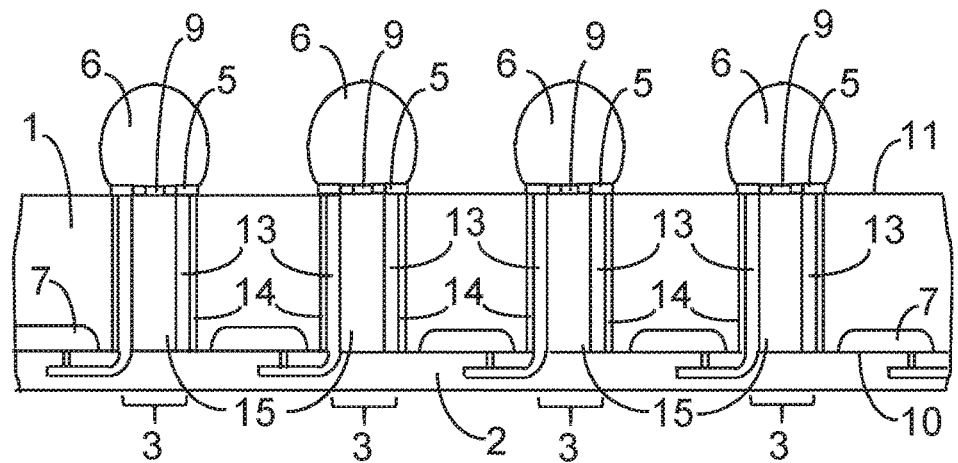
FIG. 6 is a cross section of a further embodiment of the semiconductor device comprising a predetermined breaking point.

FIG. 6 is a cross section of a further embodiment of the semiconductor device comprising a predetermined breaking point 9 in the layer of the under-bump metallization 5. Elements of the embodiment according to FIG. 6 that correspond to elements of the embodiment according to FIG. 3 are designated with the same reference numerals. In the embodiment according to FIG. 6, the predetermined breaking point 9 is arranged in a region provided for a channel as in the embodiment according to FIG. 3. The predetermined breaking point 9, which is spanned by the bump contact 6, comprises a material different from the under-bump metallization 5. This material is cracked or made porous, so that cracks or fissures form a channel venting the cavity 15.

The material of the predetermined breaking point 9 may be a material that cracks or becomes porous at a temperature above 200° C. Resists like the photoresists conventionally used in semiconductor technology are appropriate materials for this purpose. If the bump contact 6 is formed by a solder ball, a reflow process takes place at a temperature above 200° C., typically at about 250° C. The resist becomes porous and the desired channel is formed. The predetermined breaking point 9 thus serves as a pressure relief valve protecting the TSV 3. The function of the channel is not adversely affected by small residual amounts of resist adhering to the sidewalls of the under-bump metallization 5.

Figure 7:
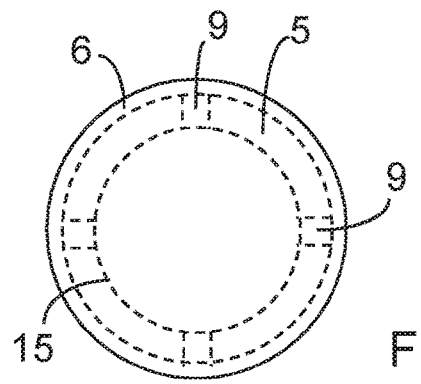
FIG. 7 is a schematic top view of a bump contact of an embodiment comprising a predetermined breaking point.

FIG. 7 is a schematic top view of a bump contact 6 of an embodiment comprising a predetermined breaking point 9 within the layer of the under-bump metallization 5. In this embodiment the under-bump metallization 5 may form a ring around the cavity 15 of the TSV 3, for instance. The region of the predetermined breaking point 9 can have any shape, provided that the channel formed by cracks or fissures extends from the cavity 15 to the outer periphery of the under-bump metallization 5, so that the cavity 15 communicates with the environment. In the embodiment according to FIG. 7, the predetermined breaking point 9 comprises four regions arranged on orthogonal diameters of the under-bump metallization 5. Arrangement and shape of the predetermined breaking point 9 are not restricted to this example.

Figure 8:
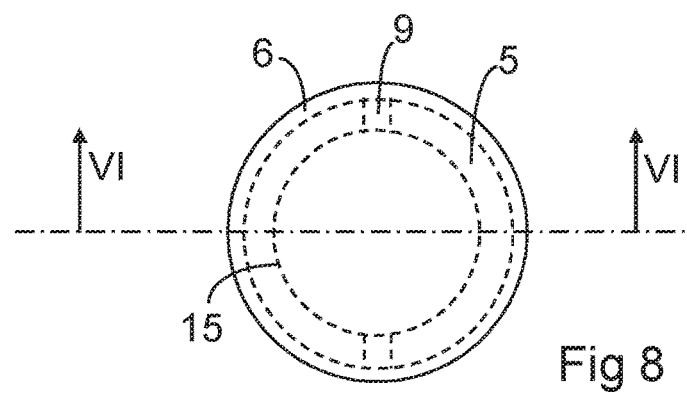
FIG. 8 is a schematic top view of a bump contact of the embodiment according to FIG. 6.

FIG. 8 is a schematic top view of the bump contact 6 of the embodiment according to FIG. 6. The predetermined breaking point 9 comprises two regions on a diameter of the under-bump metallization 5. The position of the cross section of FIG. 6 is indicated in FIG. 8 by the straight line of dots and dashes.

Figure 9:
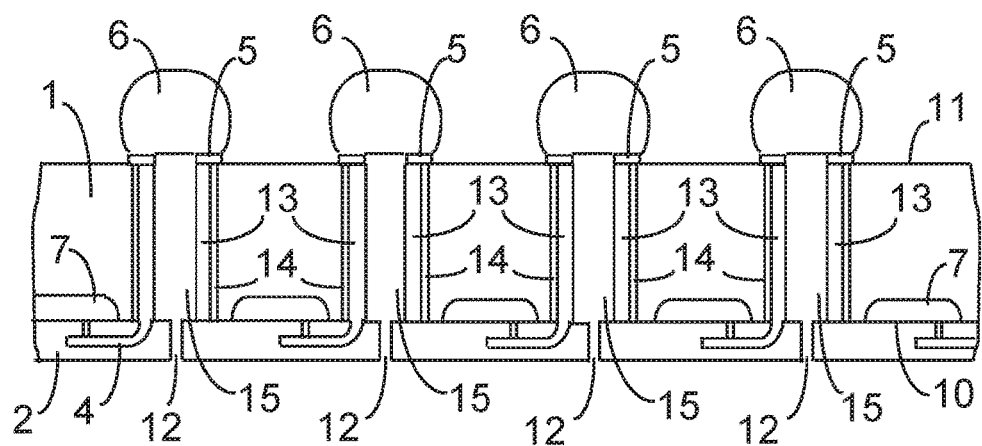
FIG. 9 is a cross section of a further embodiment of the semiconductor device comprising a pierced cover layer on the TSV.

FIG. 9 is a cross section of a further embodiment of the semiconductor device comprising a TSV 3 with a venting hole 12 in the cover layer 2 on the main surface 10 of the semiconductor substrate 1. Elements of the embodiment according to FIG. 9 that correspond to elements of the embodiment according to FIG. 6 are designated with the same reference numerals. In the embodiment according to FIG. 9, the hole 12 penetrating the cover layer 2 connects the cavity 15 of the TSV 3 with the environment, in particular with the ambient air. The TSV 3 is thus almost completely closed, and the bump contact 6 is allowed to cover the TSV 3 completely at the further main surface 11. Contamination of the TSV 3 by underfill material or the like entering the cavity 15 can thus be prevented, and stress owing to an extension of gas inside the cavity 15 is prevented at the same time.

Figure 10:
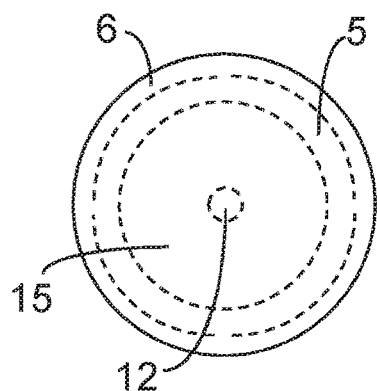
FIG. 10 is a schematic top view of a bump contact of the embodiment according to FIG. 9.

FIG. 10 is a schematic top view of the bump contact 6 of the embodiment according to FIG. 9. The outline of the position of the hole 12 is indicated with a circular broken line in the center of the area representing the cavity 15. The hole 12 can be arranged at any other suitable position in the area of the cavity 15, and there may be two or more such holes 12 in the cover layer 2 for the same TSV 3.

It is an advantage that fractures in the metallization of the TSV, in the material of the bump contacts or in the under-bump metallization are avoided even under changing ambient temperatures. If expanding liquids or gases enclosed within the TSV can escape through a venting channel, the risk of damages of bump contacts allowing small lateral dimensions of the semiconductor device is reduced. Thus the bump contacts are thermally stable. Underfill material, which may be employed to fix the device on a printed circuit board, is less likely to contaminate the interior of the TSV. This is especially favorable for unfilled TSVs, i.e., for TSVs that are not filled with solid material but may contain a gas or a liquid.

The invention claimed is:

1. A semiconductor device comprising:
   a semiconductor substrate having a main surface and a further main surface opposite the main surface;
   a TSV penetrating the substrate from the main surface to the further main surface;
   a cavity of the TSV;
   an under-bump metallization arranged adjacent to the cavity at the further main surface;
   a bump contact arranged on the under-bump metallization, the bump contact covering the cavity at least partially;
   a metallization of the TSV being arranged between the substrate and the cavity;
   an opening of the cavity at the main surface or at the further main surface, the opening providing a communication between the cavity and an environment;
   a cover layer being arranged above the TSV at the main surface; and
   a hole in the cover layer, the opening being provided by the hole.

2. The semiconductor device of claim 1, further comprising:
   an integrated circuit component in the semiconductor substrate, the integrated circuit component being provided with a wiring including at least one metal layer arranged in the cover layer.

3. A semiconductor device comprising:
   a semiconductor substrate having a main surface and a further main surface opposite the main surface;
   a TSV penetrating the substrate from the main surface to the further main surface;
   a cavity of the TSV;
   an under-bump metallization arranged adjacent to the cavity at the further main surface;
   a bump contact arranged on the under-bump metallization, the bump contact covering the cavity at least partially;
   a metallization of the TSV being arranged between the substrate and the cavity; and
   an opening of the cavity at the main surface or at the further main surface, the opening providing a communication between the cavity and an environment,
   wherein the cavity of the TSV is filled with a gas or a liquid.

4. A method of producing a semiconductor device, comprising:
   providing a semiconductor substrate with a TSV penetrating the substrate from a main surface to an opposite further main surface;
   arranging a metallization in the TSV, forming a cavity;
   arranging an under-bump metallization adjacent to the TSV at the further main surface;
   arranging a bump contact on the under-bump metallization;
   arranging the metallization between the substrate and the cavity;
   forming an opening of the cavity at the main surface or at the further main surface to provide a communication between the cavity and an environment;

arranging a cover layer above the TSV at the main surface; and forming the opening by a hole in the cover layer.

5. A method of producing a semiconductor device, comprising:

providing a semiconductor substrate with a TSV penetrating the substrate from a main surface to an opposite further main surface;

arranging a metallization in the TSV, forming a cavity;

arranging an under-bump metallization adjacent to the TSV at the further main surface;

arranging a bump contact on the under-bump metallization;

arranging the metallization between the substrate and the cavity; and forming an opening of the cavity at the main surface or at the further main surface to provide a communication between the cavity and an environment, wherein the opening is formed by structuring the under-bump metallization, so that the under-bump metallization forms a channel between the cavity and the environment, wherein a predetermined breaking point comprising a material different from the under-bump metallization is arranged at the location provided for the channel, and wherein the material of the predetermined breaking point is cracked or made porous during or after the formation of the bump contact, so that the channel is formed.

6. The method of claim 5, wherein the predetermined breaking point is formed by a material that cracks or becomes porous at a temperature above 200° C., and the bump contact is formed by a reflow process at a temperature above 200° C.

7. The method of claim 6, wherein the predetermined breaking point is formed by a photoresist.

8. A semiconductor device comprising:

a semiconductor substrate having a main surface and a further main surface opposite the main surface;

a TSV penetrating the substrate from the main surface to the further main surface;

a cavity of the TSV;

a metallization of the TSV arranged between the substrate and the cavity;

an under-bump metallization arranged adjacent to the cavity at the further main surface, the under-bump metallization not encircling the cavity;

a bump contact arranged on the under-bump metallization, the bump contact at least partially covering the cavity without closing it, thus providing a communication between the cavity and an environment;

a cover layer being arranged above the TSV at the main surface; and an integrated circuit component in the semiconductor substrate, the integrated circuit component being provided with a wiring including at least one metal layer arranged in the cover layer.

9. A semiconductor device comprising:

a semiconductor substrate having a main surface and a further main surface opposite the main surface;

a TSV penetrating the substrate from the main surface to the further main surface;

a cavity of the TSV;

a metallization of the TSV arranged between the substrate and the cavity;

an under-bump metallization arranged adjacent to the cavity at the further main surface, the under-bump metallization not encircling the cavity; and a bump contact arranged on the under-bump metallization, the bump contact at least partially covering the cavity without closing it, thus providing a communication between the cavity and an environment, wherein the cavity of the TSV is filled with a gas or a liquid.

10. The semiconductor device of claim 3, further comprising:

a cover layer being arranged above the TSV at the main surface; and an integrated circuit component in the semiconductor substrate, the integrated circuit component being provided with a wiring including at least one metal layer arranged in the cover layer.

* * * * *